United States Patent
Shim et al.

(10) Patent No.: US 10,790,200 B2
(45) Date of Patent: Sep. 29, 2020

(54) WAFER MEASUREMENT APPARATUS, WAFER MEASUREMENT SYSTEM, AND METHOD OF MANUFACTURING SEMICONDUCTOR DEVICE USING THE SAME

(71) Applicant: SAMSUNG ELECTRONICS CO., LTD., Suwon-si, Gyeonggi-do (KR)

(72) Inventors: Sung-Bo Shim, Hwaseong-si (KR); Je-Hyun Lee, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/236,761

(22) Filed: Dec. 31, 2018

(65) Prior Publication Data
US 2019/0229023 A1   Jul. 25, 2019

(30) Foreign Application Priority Data

Jan. 19, 2018   (KR) .......................... 10-2018-0007239

(51) Int. Cl.
*H01L 21/66* (2006.01)
*G01B 15/00* (2006.01)

(52) U.S. Cl.
CPC .............. *H01L 22/12* (2013.01); *G01B 15/00* (2013.01); *G01B 2210/56* (2013.01)

(58) Field of Classification Search
None
See application file for complete search history.

(56) References Cited

U.S. PATENT DOCUMENTS

| 8,988,521 B2 | 3/2015 | Yoon et al. |
| 2011/0139982 A1* | 6/2011 | Kijima ................... B82Y 10/00 250/307 |
| 2017/0046588 A1 | 2/2017 | Cho |

FOREIGN PATENT DOCUMENTS

| JP | 2011-197120 A | 10/2011 |
| KR | 10-0234289 | 9/1999 |
| KR | 10-2000-0020066 | 4/2000 |
| KR | 10-0548722 | 1/2006 |
| KR | 10-2008-0102654 | 11/2008 |
| KR | 10-2017-0019949 | 2/2017 |

* cited by examiner

*Primary Examiner* — Asok K Sarkar
(74) *Attorney, Agent, or Firm* — Volentine, Whitt & Francos, PLLC

(57) ABSTRACT

A wafer measurement system for measuring a measurable characteristic of a first measurement target formed on a wafer includes: a memory and a processor. The memory is configured to store an image of the wafer, multiple templates each including at least one line, and a measurement program. The processor is accessible to the memory and is configured to execute multiple modules included in the measurement program. The modules include: a template selection module configured to receive the templates and select a measurement template corresponding to a shape of the first measurement target; a template matching module configured to match the measurement template to the first measurement target; and a measurement module configured to measure the measurable characteristic of the first measurement target based on position information of the measurement template.

20 Claims, 12 Drawing Sheets

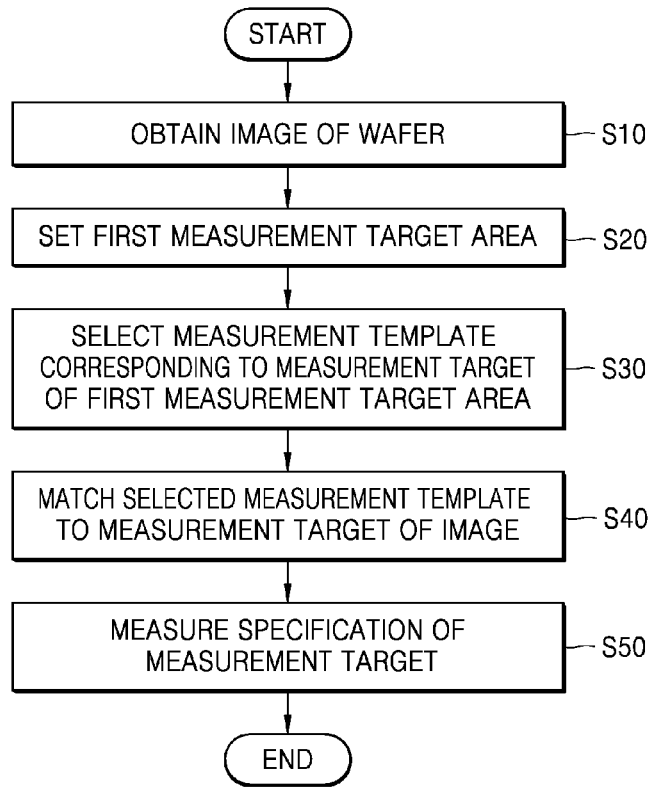
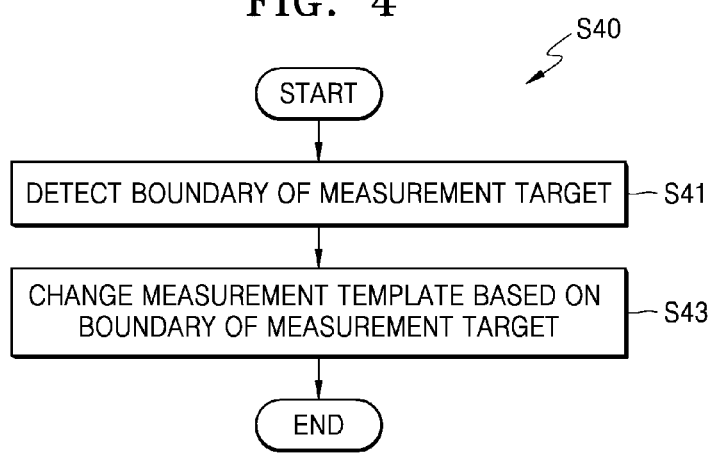

WAFER MEASUREMENT APPARATUS, WAFER MEASUREMENT SYSTEM, AND METHOD OF MANUFACTURING SEMICONDUCTOR DEVICE USING THE SAME

CROSS-REFERENCE TO RELATED APPLICATION

This U.S. non-provisional patent application claims priority under 35 U.S.C. § 119 to Korean Patent Application No. 10-2018-0007239, filed on Jan. 19, 2018 in the Korean Intellectual Property Office, the disclosure of which is incorporated herein in its entirety by reference.

BACKGROUND

1. Technical Field

The present disclosure relates to a wafer measurement system and a method of manufacturing a semiconductor device. More particularly, the present disclosure relates to a wafer measurement system for measuring a measurable characteristic of a measurement target formed on a wafer, and a method of manufacturing a semiconductor device using measured data.

2. Description of the Related Art

In general, in order to produce a final semiconductor device through a series of semiconductor device manufacturing processes, a number of unit processes need to be performed. Accordingly, multiple semiconductor manufacturing apparatuses (e.g., CVD equipment, sputtering equipment, etching equipment, measuring equipment, etc.) are arranged in a semiconductor production line in order to satisfy a high level of precision. These semiconductor manufacturing apparatuses proceed with semiconductor manufacturing processes in a planned process sequence. In order to manage the process efficiency of semiconductor processing equipment performing various processes, technology for efficiently measuring patterns formed on a wafer is needed.

SUMMARY

The inventive concept(s) described in the present disclosure may be used to provide a wafer measurement system for precisely and quickly measuring a measurable characteristic of a measurement target formed on a wafer, and a method of manufacturing a semiconductor device using the same.

According to an aspect of the present disclosure, a wafer measurement system for measuring a measurable characteristic of a first measurement target formed on a wafer includes a memory and a processor. The memory is configured to store an image of the wafer, multiple (a plurality of) templates each including at least one line, and a measurement program. The processor is accessible to the memory and is configured to execute multiple modules included in the measurement program. The modules include: a template selection module configured to receive the templates and select a measurement template corresponding to a shape of the first measurement target; a template matching module configured to match the measurement template to the first measurement target; and a measurement module configured to measure the measurable characteristic of the first measurement target based on position information of the measurement template.

According to another aspect of the present disclosure, a method of manufacturing a semiconductor device includes measuring, by a processor, a measurable characteristic of at least one measurement target formed on a wafer; and manufacturing the semiconductor device based on a result of the measuring. The measuring of the measurable characteristic of the at least one measurement target includes: obtaining an image of the wafer and multiple (a plurality of) templates; setting, in the image, a first measurement target area including a first measurement target from among the at least one measurement target. The measuring of the measurable characteristic also includes selecting a measurement template corresponding to the first measurement target; matching the selected measurement template to the first measurement target in the first measurement target area; and measuring a measurable characteristic of the first measurement target based on position information of the measurement template.

According to another aspect of the present disclosure, a measurement apparatus for measuring a measurable characteristic of a first measurement target formed on a wafer includes a memory, a processor, and an output unit. The memory is configured to store an image of the wafer, multiple (a plurality of) templates each including at least one line, and a measurement program. The processor is accessible to the memory and is configured to execute multiple modules included in the measurement program. The output unit is configured to output results of a process of measuring the measurable characteristic. The modules include: a template selection module configured to receive the templates and select a measurement template corresponding to a shape of the measurement target; a template matching module configured to match the measurement template to the measurement target; and a measurement module configured to measure the measurable characteristic of the measurement target based on position information of the measurement template.

BRIEF DESCRIPTION OF THE DRAWINGS

Example embodiments of the present disclosure will be more clearly understood from the following detailed description taken in conjunction with the accompanying drawings in which:

FIG. 3 is a flowchart illustrating an operation of a wafer measurement system according to an embodiment of the present disclosure.

FIG. 4 is a flowchart illustrating an operation of a wafer measurement system according to an embodiment of the present disclosure.

DETAILED DESCRIPTION OF THE EMBODIMENTS

Figure 1:
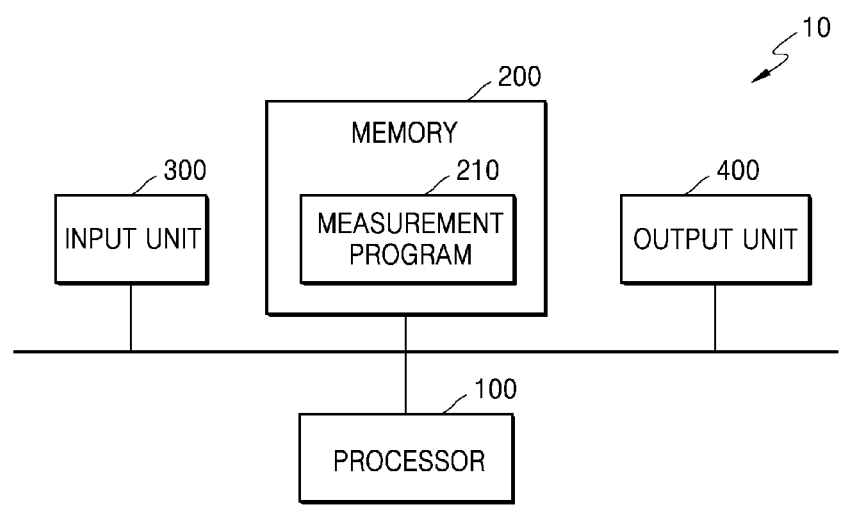
FIG. 1 is a block diagram illustrating a wafer measurement system according to embodiments of the present disclosure.

FIG. 1 is a block diagram illustrating a wafer measurement system according to embodiments of the present disclosure. According to an embodiment, a wafer measurement system 10 of FIG. 1 is a computer-based wafer measurement system, which may be a computing system that receives various kinds of information for performing an operation to measure a specification (measurable characteristic) and output a measured result. The wafer measurement system 10 of FIG. 1 may be implemented as a single measurement system.

The term "wafer" in the present disclosure refers to a wafer in a semiconductor manufacturing process or a wafer on which the semiconductor manufacturing process is completed. That is, the wafer may include one or more various layers (e.g., a resist layer, an insulating layer, a conductive layer, etc.) that may be formed on a substrate. The term "specification" may refer to geometric properties of structures formed on the wafer, and thus may refer to one or more measurable characteristics of a measurable target formed on the wafer. Measurable characteristics include, for example, a thickness, a uniformity, electrical characteristics, optical characteristics, etc. of a deposited layer. Thus, measurable characteristics of structures formed on the wafer as described herein can include, for example, geometric characteristics, shape characteristics, physical characteristics, tangible characteristics, visible characteristics.

The wafer measurement system 10 may include a processor 100, a memory 200, an input unit 300, and an output unit 400. The processor 100, the memory 200, the input unit 300, and the output unit 400 may be connected to each other via a bus, and the processor 100 may control the memory 200, the input unit 300, and the output unit 400.

A processor 100 as described herein is tangible and non-transitory. As used herein, the term "non-transitory" is to be interpreted not as an eternal characteristic of a state, but as a characteristic of a state that will last for a period. The term "non-transitory" specifically disavows fleeting characteristics such as characteristics of a carrier wave or signal or other forms that exist only transitorily in any place at any time. A processor 100 is an article of manufacture and/or a machine component. A processor 100 is configured to execute software instructions to perform functions as described in the various embodiments herein. A processor 100 may be a general-purpose processor or may be part of an application specific integrated circuit (ASIC). A processor 100 may also be a microprocessor, a microcomputer, a processor chip, a controller, a microcontroller, a digital signal processor (DSP), a state machine, or a programmable logic device. A processor 100 may also be a logical circuit, including a programmable gate array (PGA) such as a field programmable gate array (FPGA), or another type of circuit that includes discrete gate and/or transistor logic. Additionally, any processor 100 described herein may include multiple processors, parallel processors, or both. Multiple processors may be included in, or coupled to, a single device or multiple devices.

The processor 100 may perform various processing operations related to a specification measuring operation of a measurement target formed on a wafer. The processor 100 may perform various operations related to embodiments of the present disclosure by executing a control program stored in the memory 200.

In an embodiment, a measurement program 210 is stored in the memory 200 and the processor 100 may measure a specification of measurement targets formed on a wafer by executing the measurement program 210 stored in the memory 200. The specification may include a horizontal width in a direction parallel to the wafer, a depth in a direction perpendicular to a direction parallel to the wafer, and the like. For example, the specification may include a width of a gate line of a transistor formed in a wafer, a thickness of a deposited layer, and the like.

The memory 200 may store various kinds of information used in a processing operation of the processor 100. For example, the memory 200 may store an image of a wafer for measuring a specification of a measurement target. The memory 200 may further store multiple templates used by the processor 100 for measuring the specification of the measurement target. The memory 200 may also store various processing operation results. For example, the memory 200 may store a result of the processor 100 executing the measurement program 210.

The memory 200 may include various semiconductor memories, hard disks, and the like. The memory 200 may be implemented as a volatile memory or a non-volatile memory including a flash memory.

The input unit 300 is configured to be operated by a user, and may include, for example, a keyboard, an operation panel, or various data reading devices. The input unit 300 may receive an image of a wafer for measuring a specification. The image of the wafer may be stored in the memory 200.

The output unit 400 may include a monitor, a printer, and a writing device. Operations and operation results of a wafer measurement system according to an embodiment of the present disclosure may be provided to a user through the output unit 400. In an embodiment, when the output unit 400 is a display device, a boundary line for determining whether a measurement template coincides with a boundary of the measurement target and a measured line for measuring a specification of the measurement target may be displayed in different colors, for user convenience. Further, a measured line perpendicular to a main surface of a wafer and a measured line parallel to the main surface of the wafer may be displayed in different colors. However, the measured lines are not limited to being displayed in different colors, and may be displayed as lines of different types or lines of different thicknesses. For example, a line perpendicular to the main surface of the wafer may be displayed as a straight line, and a line horizontal to the main surface of the wafer may be displayed as a dotted line.

The wafer measurement system according to an embodiment of the present disclosure may measure a specification of a measurement target by using multiple templates previously stored in the memory 200 or separately generating a template corresponding to a measurement target area. Since specifications of different measurement targets having substantially the same structure may be repeatedly measured using a template, the time required for the measurement may be reduced.

Figure 2:
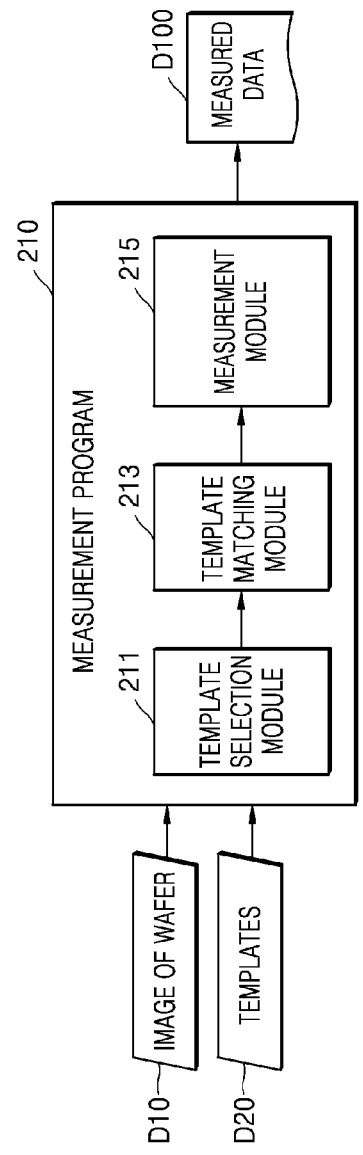
FIG. 2 is a block diagram illustrating modules for measuring a specification (measurable characteristic) of a measurement target according to an embodiment of the present disclosure that are included in a measurement program.

FIG. 2 is a block diagram illustrating modules for measuring a specification of a measurement target according to an embodiment of the present disclosure that are included in a measurement program. FIG. 3 is a flowchart illustrating an operation of a wafer measurement system according to an embodiment of the present disclosure. A specific operation according to the embodiments of the present disclosure shown in FIG. 1 will be described with reference to FIG. 2.

Referring to FIGS. 1 to 3, the measurement program 210 may include a template selection module 211, a template matching module 213, and a measurement module 215. Each of the template selection module 211, the template matching module 213, and the measurement module 215 may be implemented as a program executable by the processor 100. The processor 100 may measure a specification of a measurement target by executing multiple modules.

In operation S10, the wafer measurement system 10 may obtain an image D10 of a wafer. The image D10 of the wafer may be a scanning electron microscope (SEM) image or a transmission electron microscope (TEM) image. However, the wafer measurement system 10 according to an embodiment of the present disclosure does not perform the specification measuring operation only for the SEM image or TEM image. Rather, various images representing patterns formed on the wafer may be used for the specification measuring operation. The obtained image D10 of the wafer may be stored in the memory 200.

The measurement program 210 may be provided with the image D10 of the wafer stored in the memory 200 and multiple templates D20.

In operation S20, the wafer measurement system 10 may set a first measurement target area in the image D10 of the wafer. The first measurement target area may refer to an area including a measurement target on which the wafer measurement system 10 performs a specification measuring operation. The first measurement target area may include at least one measurement target. In an embodiment, as a user selects a measurement target area in the first measurement target area, the wafer measurement system 10 may receive a measurement target area selection signal from the outside and select a measurement target area. In an embodiment, the wafer measurement system 10 may set the first measurement target area based on position information of the other measurement target area on which a specification measuring operation is performed.

The multiple templates D20 may include lines which are guidelines for measuring specifications of patterns formed on the wafers, respectively. For example, each of the templates D20 may include a boundary line and a measured line. The boundary line is for determining whether a template D20 coincides with a boundary of a measurement target, and the measured line is for measuring a specification of the measurement target. The processor 100 may measure a specification of a measurement target corresponding to each of the templates D20 by measuring a length of a measured line included in each of the templates D20. Here, the processor 100 may measure the length of the measured line based on position information of the measured line included in each of the templates D20.

However, each of the templates D20 stored in the wafer measurement system 10 according to an embodiment of the present disclosure may include only the measured line.

In operation S30, the processor 100 may select a measurement template corresponding to a measurement target of the first measurement target area from among the templates D20 by executing the template selection module 211. For example, when measuring a width of a gate line of a transistor formed on the wafer, a measurement template corresponding to a shape of the width of the gate line may be selected. Similarly, when measuring a width of a cross-section of a contact plug contacting a source/drain region of the transistor, a measurement template corresponding to a shape of the contact plug may be selected. Thus, the selection may correspond to an expected type of measurement target, an expected shape of the measurement target, an expected size of the measurement target, or even just one of multiple different expected sizes and/or shapes (e.g., width) of a measurement target. The selection may be taken to mean identifying a measurement template among, e.g., a library of measurement templates, based on the expected type, expected shape, expected size, and/or other information.

However, the present disclosure is not limited to the case where the measurement program 210 is provided with the templates D20 stored in the memory 200. The measurement program 210 may separately generate a template corresponding to a measurement target of the image D10 of the wafer when there is no template corresponding to the measurement target of the image D10 of the wafer among the templates D20. A case of generating a template will be described later below with reference to FIGS. 8 and 9.

When a measurement template is selected in operation S30, then in operation S40, the processor 100 may execute the template matching module 213 to match the selected measurement template to the measurement target of the image D10. The matching of the measurement template to the measurement target may mean matching the measurement template with a boundary of the measurement target, and a size of the measurement template may be changed accordingly. For example, the template matching module 213 may match a boundary line of the selected measurement template to the boundary of the measurement target, and measured lines may also be changed as the boundary line is changed. The matching may involve visually aligning the boundary line to the boundary, and may include analyzing individual pixels to exactly identify and confirm the boundary. Operation S40 of matching the measurement template will be described later with reference to FIG. 4.

In operation S50, the processor 100 may measure a specification of the measurement target on the basis of the measurement template matched to the measurement target by executing the measurement module 215, and may output measured data D100. In an embodiment, the specification of the measurement target may be measured based on information on position coordinates of the measurement template. For example, the specification of the measurement target may be measured by measuring a length of at least a portion (e.g., measured lines) of multiple lines included in the measurement template. The length of the measured lines may be calculated based on the position coordinates of the measured line.

After obtaining the image D10 of the wafer, a user determines the boundary of the measurement target with the naked eyes when the user selects the measurement target for each image and manually measures a specification of the measurement target by mouse dragging. Therefore, the boundary of the measurement target may be determined differently each time specifications of different measurement targets having substantially the same shape are repeatedly measured.

Meanwhile, the wafer measurement system 10 according to the present disclosure selects a measurement template and measures a length of a measured line of the measurement template after matching a boundary of the measurement target to the boundary of the measurement template. Therefore, when the specifications of different measurement targets having substantially the same shape are repeatedly measured, measurement accuracy may be improved. In addition, since the specifications of the measurement targets may be automatically measured, time required for the measurement may be reduced.

FIG. 4 is a flowchart illustrating an operation of a wafer measurement system according to an embodiment of the present disclosure, and explains the matching operation S40 in FIG. 3.

Referring to FIGS. 2 and 4, in operation S40, a processor may match a measurement template to the measurement target of the image D10 of the wafer by executing the template matching module 213. In operation S41, the processor may detect a boundary of the measurement target by executing the template matching module 213. In operation S43, the processor may change the measurement template based on the detected boundary of the measurement target.

Operation S41 of detecting the boundary of the measurement target may be performed by using a gray level of the image D10 of the wafer. The image D10 of the wafer may be a gray image. The template matching module 213 may detect pixels containing edge components from the gray image. The edge represents a boundary of an area inside the image and represents a discrete point of pixel brightness. Detection of pixels corresponding to the edge is referred to as edge detection, and the edge detection may be performed mathematically by a differential operation. For example, the processor may execute the template matching module 213 to perform a differential operation on a gray level of a gray image from left to right and/or from right to left. The processor may determine that pixels having an absolute value of a differential value equal to or greater than a certain value are the edge. Alternatively, the processor may execute the template matching module 213 to perform a differential operation on a gray level of a gray image from top to bottom and/or from bottom to top. The processor may determine that a pixel having an absolute value of a differential value equal to or greater than a certain value is the edge.

To be clear, the detection of the boundary of the measurement target at S41 may involve detecting multiple pixels that form, for example, a line segment. The detection of the boundary of the measurement target at S41 may also be performed multiple times, to detect multiple line segments each formed by multiple pixels. Line segments may connect at ends to form an overall shape of the measurement target, such as an overall profile or outer shape of the measurement target.

Additionally, detection of the boundary of the measurement target at S41 may be performed using position information of the measurement template. For example, position information of the measurement template may be obtained and used to perform an edge detection operation within a predetermined specific range from a location where the measurement template is arranged. In other words, the detection of the boundary of the measurement target at S41 may be performed based on the position information, such as by checking for pixels in the edge in a specific area or a specific range. The detection may therefore be a form of alignment, though the identification of the edge pixels (and thus the edge) will at least sometimes involve checking pixels that are not part of the edge and determining that they are not part of the edge. Moreover, a measurement template may be aligned with the measurement target before the detection of the measurement target at S41 or as part of the detection of the measurement target at S41, such as by rotating the measurement template, moving the measurement template vertically and/or horizontally, or otherwise to limit the number of pixels being evaluated in the process.

In operation S43, the processor may execute the template matching module 213 to change the measurement template so that a boundary line of the measurement template coincides with the boundary of the measurement target. Accordingly, a size of the measurement template may be changed. As the boundary line of the measurement template is changed, the measured lines of the measurement template may also be changed.

FIGS. 5A to 5D are views illustrating an operation of a wafer measurement system according to an embodiment of the present disclosure.

Referring to FIGS. 3 to 5A, in operation S10, the wafer measurement system (e.g., 10 of FIG. 1) may obtain an image IM of a wafer. In an embodiment, the image IM of the wafer may be an SEM image or a TEM image. Although the image IM of the wafer shown in FIG. 5A and the like is images in a direction perpendicular to a main surface of the wafer, an image subjected to an operation of a wafer measurement system according to an embodiment of the present disclosure is not limited to the image in the vertical direction.

In operation S20, a first measurement target area MA_1 may be set in the image IM of the wafer. The first measurement target area MA_1 may be set by a user, or may be set based on position information of the other measurement target area on which the wafer measurement system has performed a specification measuring operation or the shape of patterns included in the other measurement target area.

At least one measurement target may be included in the first measurement target area MA_1 of the image IM of the wafer. For example, the first measurement target area MA_1 may include a first measurement target M1 and a second measurement target M2. The first measurement target M1 and the second measurement target M2 may form a first measurement target group MG1. In the drawings, the first measurement target M1 is a contact plug in contact with a source/drain region of a FinFET, and the second measurement target M2 is a gate structure of the FinFET. However, it is only for convenience of explanation and an embodiment according to the present disclosure is not limited thereto.

In an embodiment, the first measurement target area MA_1 may be set based on a structure repeatedly formed in the image IM of the wafer. For example, since one contact plug and one gate structure are repeatedly formed in FIG. 5A, the first measurement target area MA_1 may be set to include one contact plug and one gate structure. However, the measurement target area(s) described herein are not limited thereto, and the first measurement target area MA_1 may be set to be wider so as to include two contact plugs and two gate structures.

The wafer measurement system may measure a specification of a measurement target in units of the first measurement target group MG1. That is, the wafer measurement system may measure a specification of at least one measurement target included in the other measurement target group after measuring a specification of at least one measurement target included in the measurement target group MG1. Measurement targets having substantially the same shape among multiple measurement targets may be included in different measurement target groups, and specifications may be sequentially measured.

Figure 5A:
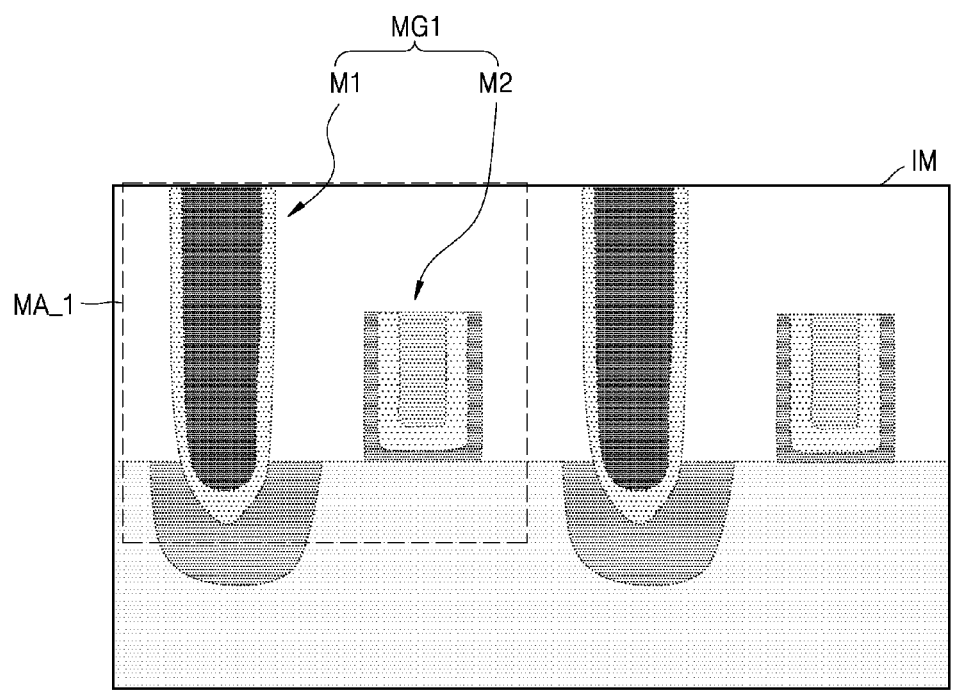
FIGS. 5A to 5D illustrate views of an operation of a wafer measurement system according to an embodiment of the present disclosure.
Figure 5B:
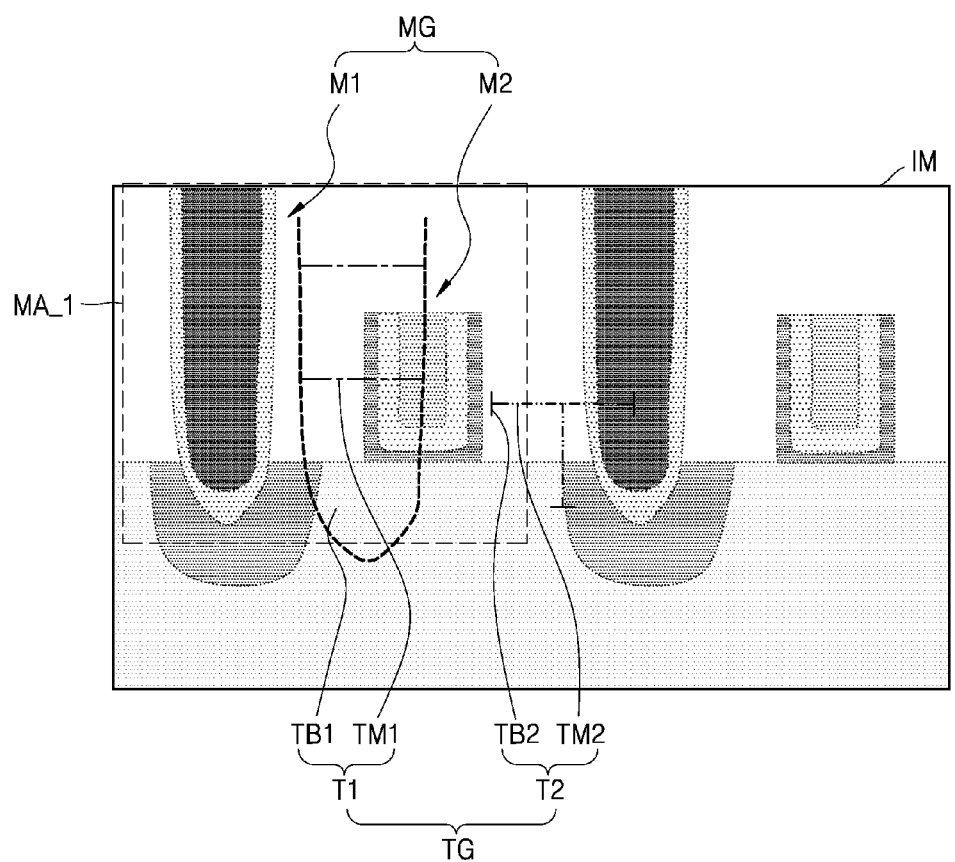

Referring to FIGS. 3 and 5B, in operation S30, the first measurement template T1 corresponding to the first measurement target M1 and the second measurement template T2 corresponding to the second measurement target M2 may be selected from among multiple templates stored in a memory.

The first measurement template T1 may include a first boundary line TB1 for determining whether the first measurement template T1 coincides with a boundary of the first measurement target M1 and a first measured line TM1 for measuring a specification of the first measurement target M1. Both ends of the first measured line TM1 may be formed in contact with the first boundary line TB1. In FIG. 5B, the first measured line TM1 includes two lines for measuring a width in a horizontal direction, but the measured line(s) described herein are not limited thereto. The first measured line TM1 may be changed according to a specification to be measured in the first measurement target M1. Furthermore, FIG. 5B shows the first measurement template T1 including both the first boundary line TB1 and the first measured line TM1. However, the measurement template(s) described herein are not limited thereto. The first measurement template T1 may include only the first measured line TM1. When an output unit (e.g., 400 in FIG. 1) is a display device, the first boundary line TB1 and the first measured line TM1 may be displayed in different colors.

The second measurement template T2 may include a second boundary line TB2 for determining whether the second measurement template T2 coincides with a boundary of the second measurement target M2 and a second measured line TM2 for measuring a specification of the second measurement target M2. Both ends of the second measured line TM2 may be formed in contact with the second boundary line TB2. In FIG. 5B, the second measured line TM2 includes two lines for measuring a width in a lateral direction and a depth in a longitudinal direction, but the measured line(s) described herein are not limited thereto. The second measured line TM2 may be changed according to a specification to be measured in the second measurement target M2. Furthermore, FIG. 5B shows the second measurement template T2 including both the second boundary line TB2 and the second measured line TM2. However, the measurement template(s) described herein are not limited thereto. The second measurement template T2 may include only the second measured line TM2.

Figure 5C:
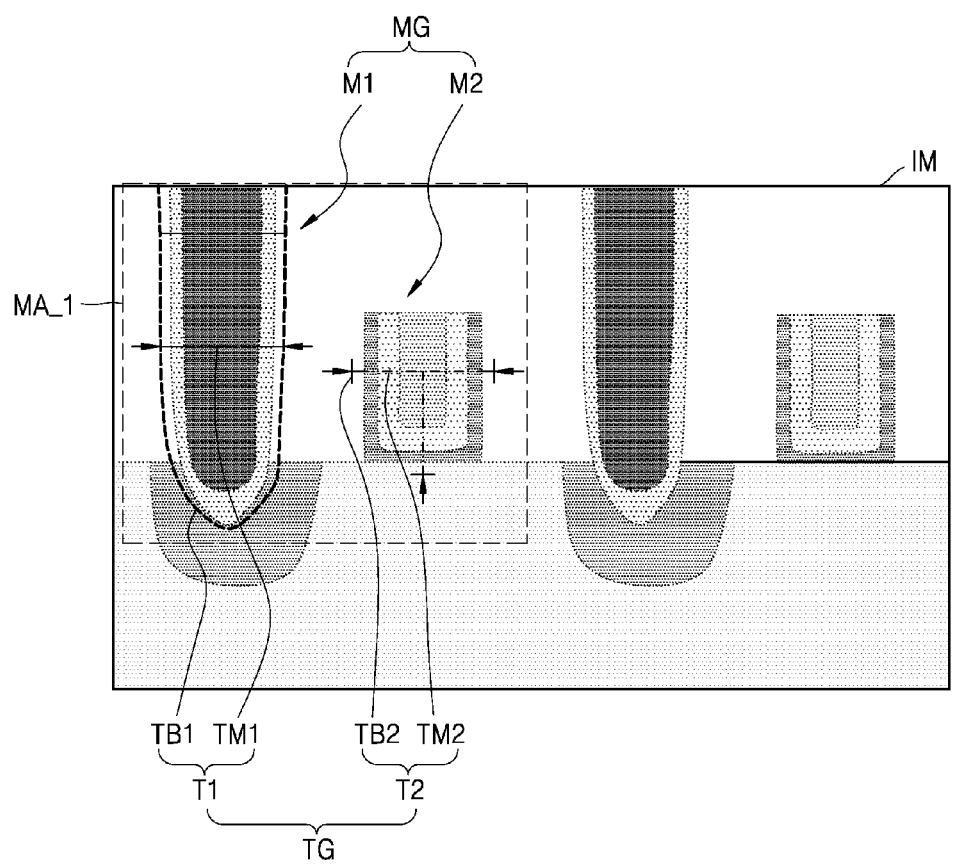

Referring to FIGS. 4 and 5C, the first measurement template T1 and the second measurement template T2 may be arranged on the first measurement target M1 and the second measurement target M2, respectively. A user may directly move the first measurement template T1 and the second measurement template T2, but the arrangement of the measurement templates described herein is not limited thereto. Based on position information of other measurement targets included in another measurement target area on which a specification measuring operation has already been performed and having substantially the same shape as the first measurement target M1 and the second measurement target M2, the first measurement template T1 and the second measurement template T2 may be arranged on the first measurement target M1 and the second measurement target M2, respectively.

In operation S41, a boundary between the first measurement target M1 and the second measurement target M2 may be detected. An operation of detecting the boundary between the first measurement target M1 and the second measurement target M2 from the first boundary line TB1 and the second boundary line TB2 of the first measurement template T1 and the second measurement template T2 on the first measurement target M1 and the second measurement target M2 within a specific range may further be included.

In operation S43, the first boundary line TB1 may be changed so as to coincide with the detected boundary of the first measurement target M1 and the second boundary line TB2 may be changed so as to coincide with the boundary of the second measurement target M2. As the first boundary line TB1 and the second boundary line TB2 are changed, the first measured line TM1 and the second measured line TM2 may also be changed.

When the first measurement template T1 and the second measurement template T2 include the first measured line TM1 and the second measured line TM2 but not the first boundary line TB1 and the second boundary line TB2, the first measured line TM1 and the second measured line TM2 may be changed such that both ends of the first measured line TM1 and the second measured line TM2 are in contact with the boundaries of the first measurement target M1 and the second measurement target M2, respectively.

Figure 5D:
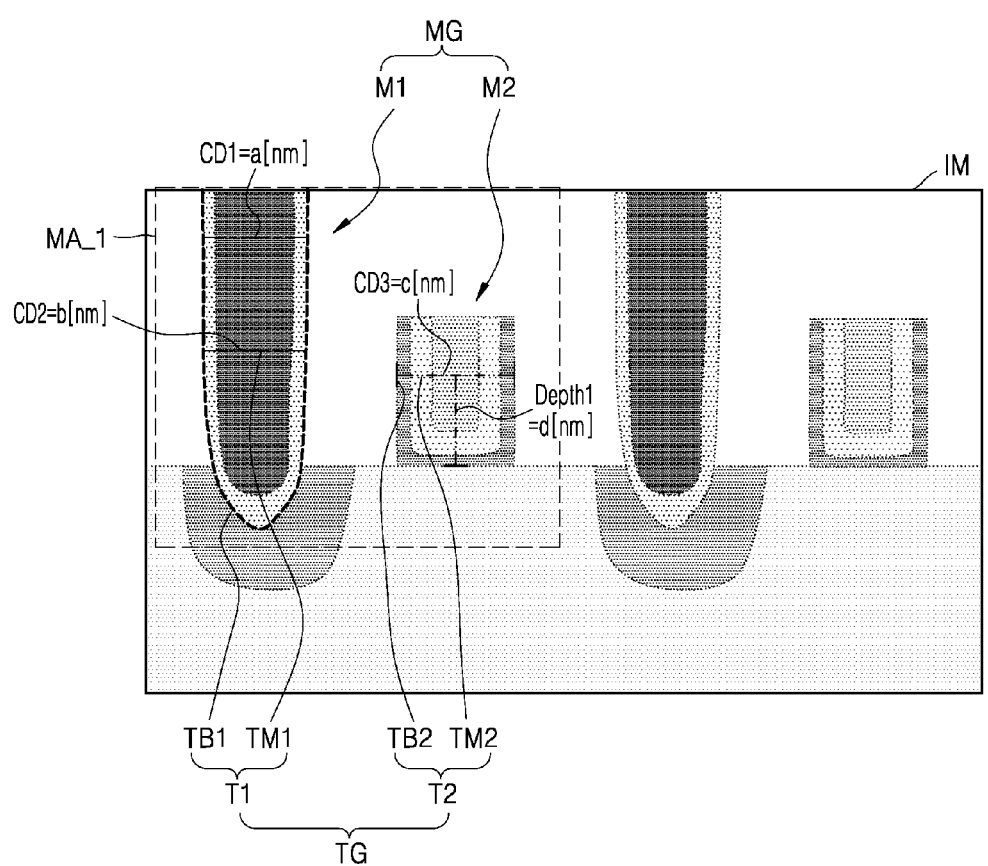

Referring to FIGS. 3 and 5D, in operation S50, specifications of the first measurement target M1 and the second measurement target M2 may be measured by measuring lengths of the first measured line TM1 and the second measured line TM2. For example, in FIG. 5D, the length of the first measured line TM1 is measured so that a first width CD1 of the first measurement target M1 may be measured as a[nm] and a second width CD2 of the first measurement target M1 as b[nm]. Furthermore, the length of the second measured line TM2 is measured so that a third width CD3 of the second measurement target M2 may be measured as c[nm] and a first depth Depth1 of the second measurement target M2 as d[nm].

Figure 6:
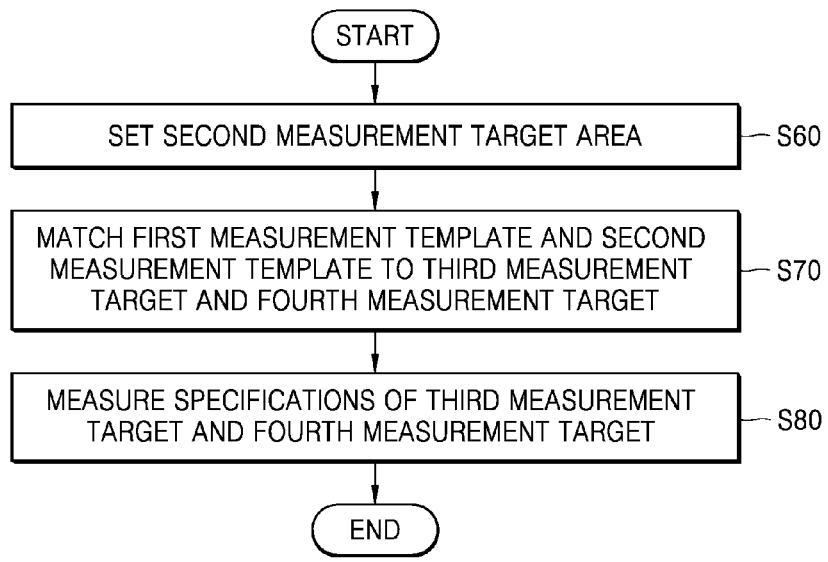
FIG. 6 is a flowchart illustrating an operation of a wafer measurement system according to an embodiment of the present disclosure.
Figure 7:
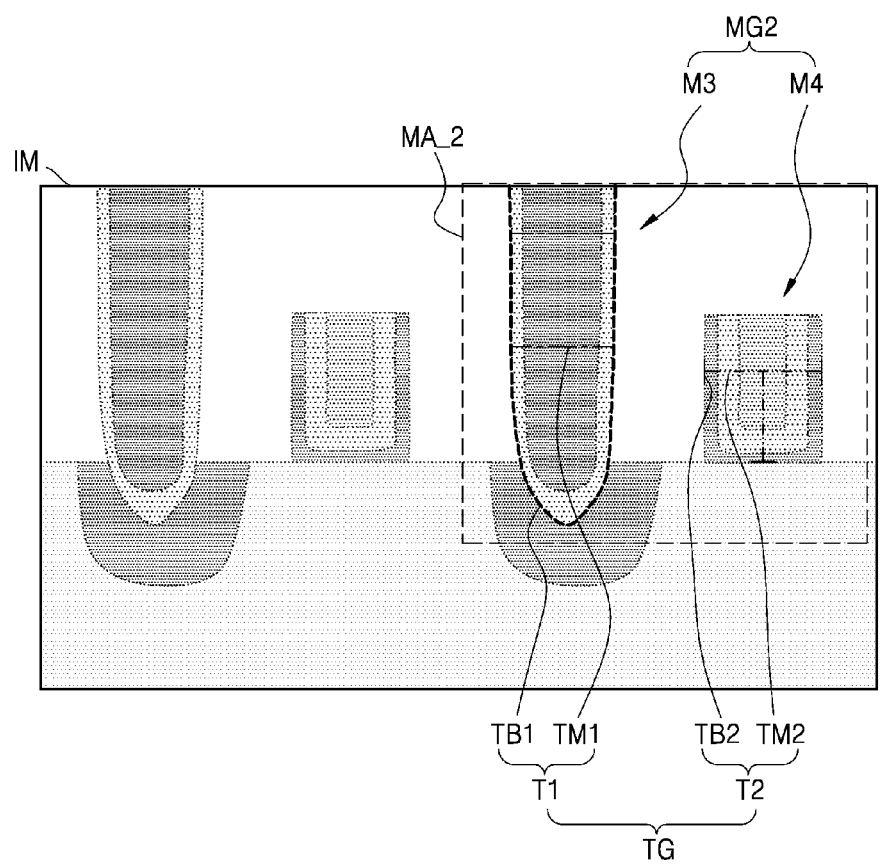
FIG. 7 is a view illustrating an operation of measuring a specification (measurable characteristics) of a measurement target by a wafer measurement system according to an embodiment of the present disclosure.

FIG. 6 is a flowchart illustrating an operation of a wafer measurement system according to an embodiment of the present disclosure, and explains an operation after operation S50 of measuring the specification of the measurement target in FIG. 3. FIG. 7 illustrates a view of an operation of measuring a specification of a measurement target by a wafer measurement system according to an embodiment of the present disclosure. FIG. 7 is an image in a direction perpendicular to a main surface of a wafer.

Referring to FIGS. 6 and 7, in operation S60, a processor may set a second measurement target area MA_2 in the image IM of the wafer following the first measurement target area MA_1. The second measurement target area MA_2 may be set by a user or by deriving position information of the second measurement target area MA_2 based on position information of the first measurement target area MA_1 in which the wafer measurement system performs a specification measuring operation. The first measurement target area MA_1 and the second measurement target area MA_2 may be adjacent to each other.

In the drawings, the second measurement target area MA_2 is set in the image IM of the wafer on which the first measurement target area is set, but the second measurement target area MA_2 may be set in an image of another wafer.

At least one measurement target may be included in the second measurement target area MA_2 of the image IM of the wafer. For example, the second measurement target area MA_2 may include a third measurement target M3 and a fourth measurement target M4. The third measurement target M3 and the fourth measurement target M4 may form a second measurement target group MG2. The third measurement target M3 may have substantially the same shape as the first measurement target M1 and the fourth measurement target M4 may have substantially the same shape as the second measurement target M2.

Therefore, the first measurement template T1 and the second measurement template T2 used for measuring specifications of the first measurement target M1 and the second measurement target M2 may also be used to measure specifications of the third measurement target M3 and the fourth measurement target M4.

In operation S70, the processor may match the first measurement template T1 and the second measurement template T2 to the third measurement target M3 and the fourth measurement target M4 by executing a template matching module. The description of the matching operation S40 of FIG. 4 may be applied to the matching operation S70.

In operation S80, the processor may measure specifications of the third measurement target M3 and the fourth measurement target M4 by executing the measurement module, based on the first measurement template T1 and the second measurement template T2 which coincide with the third measurement target M3 and the fourth measurement target M4.

When similar patterns are repeatedly formed on a wafer, the wafer measurement system according to the present disclosure may repeatedly measure specifications of the patterns by using a selected measurement template. Therefore, the time taken to measure the specifications may be reduced.

Figure 8:
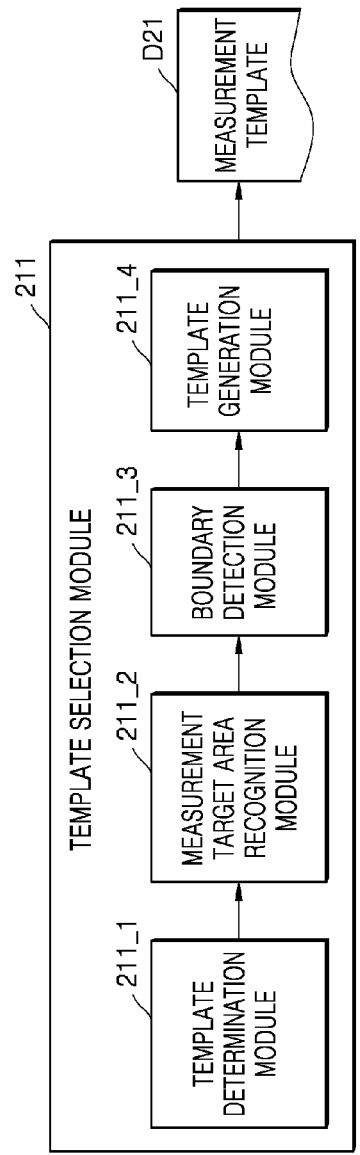
FIG. 8 is a block diagram illustrating modules for measuring a specification (measurable characteristics) of a measurement target according to an embodiment of the present disclosure that are included in a measurement program.
Figure 9:
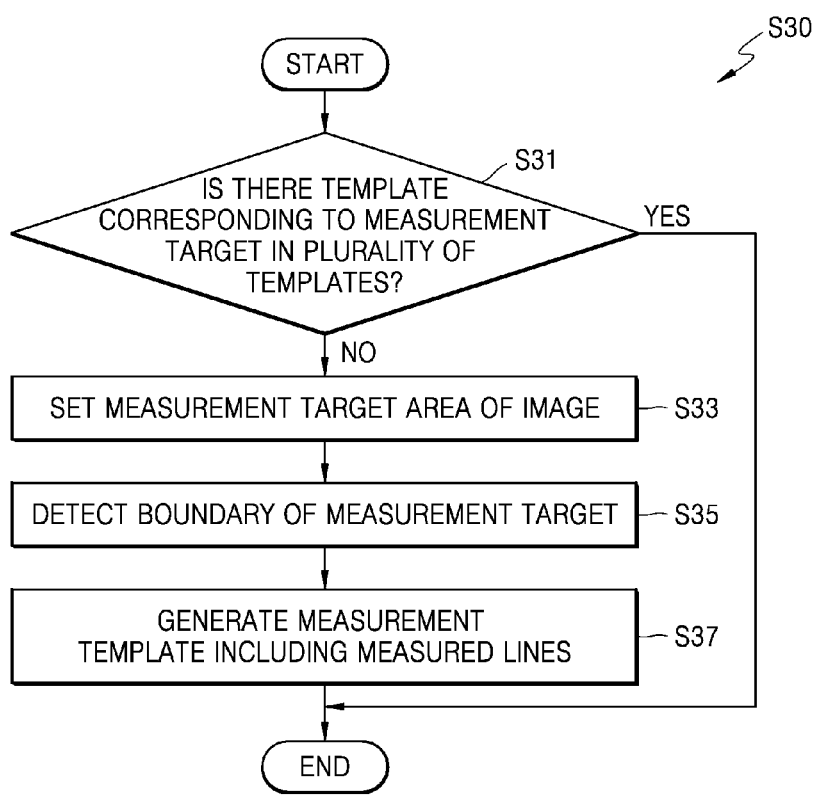
FIG. 9 is a flowchart illustrating an operation of a wafer measurement system according to an embodiment of the present disclosure.

FIG. 8 is a block diagram illustrating modules for measuring a specification of a measurement target according to an embodiment of the present disclosure. The modules are included in a measurement program, and the modules shown in FIG. 8 include a template selection module. FIG. 9 is a flowchart illustrating an operation of a wafer measurement system according to an embodiment of the present disclosure. FIG. 9 explains operation S30 of selecting the measurement template in FIG. 3.

Referring to FIGS. 8 and 9, the template selection module 211 may include a template determination module 211_1, a measurement target area recognition module 211_2, a boundary detection module 211_3, and a template generation module 211_4. Each of the template determination module 211_1, the measurement target area recognition module 211_2, the boundary detection module 211_3, and the template generation module 211_4 may be implemented as a program executable by the processor 100. The processor 100 may select a measurement template D21 corresponding to a measurement target by executing the template determination module 211_1, the measurement target area recognition module 211_2, the boundary detection module 211_3, and the template generation module 211_4.

As described below, the process of generating a measurement template may include setting a measurement target area comprising the first measurement target at S33, detecting a boundary of the first measurement target as a detected boundary at S35, and generating a measurement template that includes at least a portion of the detected boundary of the first measurement target and a measured line for measuring the measurable characteristic of the first measurement target as a generated measurement template at S37.

In operation S31, the processor may determine whether there is a template corresponding to the measurement target in multiple templates stored in a memory by executing the template determination module 211_1. If there is the corresponding template, the template determination module 211_1 selects the template corresponding to the measurement target from among the multiple templates, and may sequentially perform the operations S40 and S50 of FIG. 3.

If there is no template corresponding to the measurement target, the process may perform an operation of generating the measurement template D21 corresponding to the measurement target by sequentially executing the measurement target area recognition module 211_2, the boundary detection module 211_3, and the template generation module 211_4.

In operation S33, the processor may set a measurement target area to perform a specification measuring operation by executing the measurement target area recognition module 211_2. The measurement target area may be set to include the measurement target. If the measurement target area is the same as the first measurement target area, the operation of setting the measurement target area may not be performed.

In operation S35, the processor may detect a boundary of the measurement target included in the measurement target area as a detected boundary by executing the boundary detection module 211_3. The description of operation S41 of detecting the boundary of the measurement target of FIG. 4 may be applied to operation S35 of detecting the boundary of the measurement target. Thus, the processor may perform a differential operation on a gray level of a measurement target area of an image of a wafer from left to right, right to left, top to bottom, and/or bottom to top by executing the boundary detection module 211_3. The processor may determine that a point at which a result of the differential operation is equal to or greater than a certain value is a boundary of a measurement target.

In operation S37, the processor may generate a measurement template including measured lines by executing the template generation module 211_4. The processor may generate at least a portion of the boundary of the measurement target as a boundary line by executing the template generation module 211_4. Furthermore, the processor may generate a measured line representing a specification to be measured at the measurement target by executing the template generation module 211_4.

In an embodiment, the measured lines may be set by a user directly. For example, when a user selects a portion to be measured at the measurement target after the boundary of the measurement target is detected in operation S35, the wafer measurement system may receive a measured line generation signal through an input unit and generate measured lines based on the measured line generation signal. The user may select a portion whose length is to be measured, and measured lines may be generated at the selected portion.

In an embodiment, the measured lines may be generated by a predetermined rule. Information on a measuring point for measuring a specification for a shape of each of measurement targets may be stored in a memory. The processor may generate a measurement template including measured lines formed at the measuring point by executing the template generation module 211_4 based on the information on the measuring point.

The measured lines of the measurement template may be displayed in different colors in the output unit 400 depending on whether the measured lines are vertical or horizontal to a main surface of the wafer. For example, referring to FIG. 5D, the third width CD3 of the measurement target M2 may be displayed in red, and the first depth Depth1 may be displayed in blue. However, the measured lines are not limited to being displayed in different colors, and may be displayed as lines of different types or lines of different thicknesses. For example, a line perpendicular to the main surface of the wafer may be displayed as a straight line, and a line horizontal to the main surface of the wafer may be displayed as a dotted line.

When a measurement template corresponding to the measurement target is generated in operation S37, the process may sequentially perform operation S40 and operation S50 in FIG. 3. The generated measurement template D21 may be stored in a memory of the wafer measurement system. The measurement template D21 may be included in the templates D20 in FIG. 2. As described in FIGS. 6 and 7, the wafer measurement system may use a generated measurement template when a specification measuring operation is used for another measurement target having substantially the same shape as the above-described measurement target.

Figure 10:
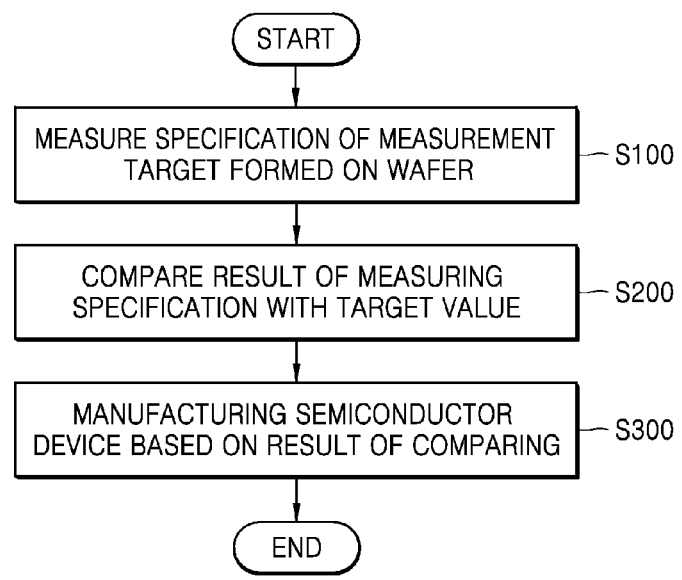
FIG. 10 is a flowchart illustrating a method of manufacturing a semiconductor device according to an embodiment of the present disclosure.

FIG. 10 is a flowchart illustrating a method of manufacturing a semiconductor device according to an embodiment of the present disclosure.

Referring to FIG. 10, the method of manufacturing a semiconductor device may include operation S100 of measuring a specification of a measurement target formed on a wafer, operation S200 of comparing a result of measuring the specification with a target value, and operation S300 of manufacturing a semiconductor device based on a result of the comparing.

Operation S100 of measuring the specification of the measurement target may include operation S10 of obtaining an image of the wafer of FIG. 3, operation S20 of setting a first measurement target area S20, operation S30 of selecting a measurement template S30, operation S40 of matching the measurement template to the measurement target, and operation S50 of measuring a specification of the measurement target. Operation S100 of measuring a specification of a pattern formed on the wafer may further include operations S60, S70 and S80. Operation S60 is the operation of setting the second measurement target area in FIG. 6. Operation S70 is the operation of matching the measurement template to a measurement target in the second measurement target area. Operation S80 is the operation of measuring a specification of the measurement target in the second measurement target area.

If a result of measuring the specification satisfies a target value in operation S200 of comparing the result of measuring the specification with the target value, the operations may be maintained as they are, and operation S300 of manufacturing the semiconductor device using an already used process recipe may be performed. When the target value is satisfied, it means that the measured value is within a range of an upper control limit (UCL) and a lower control limit (LCL) of the target value.

On the other hand, when the measurement result of the specification of the pattern formed on the wafer does not satisfy the target value, an operation of determining a cause of out-of-specification may be performed. The out-of-specification may mean that the measured value is outside the range of the UCL and the LCL of the target value. The operation of determining the cause of the out-of-specification may include an operation of determining a defective process factor causing the out-of-specification from among multiple process factors (e.g., a temperature, a pressure, a process time, and concentration of a process gas) included in a process recipe. If the defect process factor is determined, a new process recipe may be created by complementing it. Operation S300 of manufacturing a semiconductor device may be performed based on the new process recipe.

According to the method of manufacturing the semiconductor device according to an embodiment of the present disclosure, a time for measuring a specification of a pattern formed on a wafer is reduced and accuracy is improved, so that defects occurring at a time for manufacturing the wafer may be detected quickly. Therefore, a time for manufacturing the semiconductor device may be reduced.

Embodiments have been illustrated and described in the drawings and the detailed description as described above. Although the specific terms are used to explain these embodiments in the present disclosure, the specific terms are not intended to restrict the scope of the inventive concept(s) described herein and are only used for a better understanding. It will be understood by those of ordinary skill in the art that various changes in form and details may be made without departing from the spirit and scope of the inventive concept(s) described herein as defined by the appended claims. Therefore, the scope of the present disclosure is defined not by the detailed description of the present disclosure but by the appended claims.

What is claimed is:

1. A method of manufacturing a semiconductor device, the method comprising:
    measuring, by a processor, a measurable characteristic of at least one measurement target formed on a wafer; and
    manufacturing the semiconductor device based on a result of the measuring, wherein the measuring of the measurable characteristic of the at least one measurement target comprises:
    obtaining an image of the wafer and a plurality of measurement templates;
    setting, in the image, a first measurement target area comprising a first measurement target from among the at least one measurement target;
    selecting a measurement template corresponding to the first measurement target from among the plurality of measurement templates as a selected measurement template;
    matching the selected measurement template with the first measurement target in the first measurement target area; and
    measuring a measurable characteristic of the first measurement target based on position information of the selected measurement template.

2. The method of claim 1, wherein the matching of the first measurement target comprises:
    detecting a boundary of the first measurement target; and
    changing a size of the selected measurement template based on the boundary of the first measurement target.

3. The method of claim 1, wherein the selected measurement template includes a boundary line for determining whether the selected measurement template coincides with a boundary of the first measurement target and a measured line for measuring the measurable characteristic of the first measurement target.

4. The method of claim 1, further comprising:
    setting, in the image, a second measurement target area comprising a second measurement target;
    matching the selected measurement template with the second measurement target in the second measurement target area; and
    measuring a measurable characteristic of the second measurement target based on the position information of the selected measurement template, wherein the second measurement target has a shape substantially the same as the first measurement target.

5. The method of claim 4, further comprising:
    measuring the measurable characteristic of the second measurement target after the measuring of the measurable characteristic of the first measurement target,
    wherein the first measurement target area and the second measurement target area are adjacent to each other.

6. The method of claim 1, wherein the selecting of the measurement template from among the plurality of measurement templates comprises:
  determining whether a measurement template corresponding to the first measurement target exists in the plurality of measurement templates; and
  selecting the measurement template corresponding to the first measurement target from among the plurality of measurement templates when the measurement template corresponding to the first measurement target exists.

7. The method of claim 1, wherein the selecting of the measurement template from among the plurality of measurement templates comprises:
  determining whether a measurement template corresponding to the first measurement target exists in the plurality of measurement templates; and
  generating the measurement template corresponding to the first measurement target from among the plurality of measurement templates when the measurement template corresponding to the first measurement target does not exist.

8. The method of claim 7, wherein the generating of the measurement template comprises:
  setting a measurement target area comprising the first measurement target;
  detecting a boundary of the first measurement target as a detected boundary; and
  generating a measurement template comprising at least a portion of the detected boundary of the first measurement target and a measured line for measuring the measurable characteristic of the first measurement target as a generated measurement template.

9. The method of claim 8, wherein the generating of the measurement template further comprises storing the generated measurement template in a memory.

10. The method of claim 1, wherein the manufacturing of the semiconductor device comprises:
  comparing a result of measuring the measurable characteristic of the first measurement target with a target value; and
  manufacturing the semiconductor device based on a result of the comparing.

11. The method of claim 1,
  wherein the method is implemented by a wafer measurement system comprising a memory and the processor;
  the memory is configured to store the image, the plurality of measurement templates, and a measurement program;
  the plurality of measurement templates each comprise at least one line; and
  the processor is accessible to the memory and configured to execute the measurement program.

12. The method of claim 11, further comprising:
  receiving the plurality of measurement templates and selecting the measurement template corresponding to the first measurement target based on a shape of the first measurement target.

13. The method of claim 12, further comprising:
  detect a boundary of the first measurement target and changing the selected measurement template based on the boundary of the first measurement target.

14. The method of claim 11, further comprising:
  setting a measurement target area of the image comprising the first measurement target;
  detecting a boundary of the first measurement target included in the measurement target area; and
  generating the measurement template corresponding to the first measurement target based on a shape of the first measurement target.

15. The method of claim 14,
  wherein the generated measurement template comprises a boundary line for determining whether the measurement template coincides with the boundary of the first measurement target and a measured line corresponding to the measurable characteristic of the first measurement target, and
  the method further comprises measuring a length of the measured line to measure the measurable characteristic of the first measurement target.

16. The method of claim 11, wherein the wafer further includes a second measurement target having a shape substantially the same as the first measurement target.

17. The method of claim 16, further comprising:
  matching the selected measurement template to the second measurement target, and
  measuring a measurable characteristic of the second measurement target based on the position information of the measurement template.

18. The method of claim 11, wherein at least one line included in the selected measurement template comprises a straight line in a direction perpendicular to a main surface of the wafer.

19. The method of claim 1, further comprising:
  receiving the plurality of measurement templates and selecting the measurement template corresponding to the first measurement target based on a shape of the first measurement target, and
  outputting results of a process of measuring the measurable characteristic.

20. The method of claim 19,
  wherein the measurement template comprises a boundary line for determining whether the measurement template coincides with a boundary of the measurement target and a measured line for measuring the measurable characteristic of the measurement target;
  the measured line comprises a first measured line perpendicular to a main surface of the wafer and a second measured line parallel to the main surface of the wafer, and
  the method further comprises displaying a color of the boundary line differently from a color of the measured line and displaying a color of the first measured line differently from a color of the second measured line.

* * * * *